(12) United States Patent
Kitai et al.

(10) Patent No.: US 10,897,818 B2
(45) Date of Patent: Jan. 19, 2021

(54) METAL-CLAD LAMINATE, METHOD FOR PRODUCING SAME, METAL FOIL WITH RESIN, AND PRINTED WIRING BOARD

(71) Applicant: Panasonic Intellectual Property Management Co., Ltd., Osaka (JP)

(72) Inventors: Yuki Kitai, Osaka (JP); Hiroaki Fujiwara, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/322,393

(22) PCT Filed: Jul. 7, 2015

(86) PCT No.: PCT/JP2015/003396
§ 371 (c)(1),
(2) Date: Dec. 27, 2016

(87) PCT Pub. No.: WO2016/009611
PCT Pub. Date: Jan. 21, 2016

(65) Prior Publication Data
US 2017/0164469 A1  Jun. 8, 2017

(30) Foreign Application Priority Data

Jul. 16, 2014  (JP) .................................. 2014-146142

(51) Int. Cl.
*H05K 1/05* (2006.01)
*B32B 15/08* (2006.01)
(Continued)

(52) U.S. Cl.
CPC ............. *H05K 1/056* (2013.01); *B32B 5/022* (2013.01); *B32B 7/04* (2013.01); *B32B 15/08* (2013.01);
(Continued)

(58) Field of Classification Search
CPC ....... C08G 65/485; H05K 1/056; H05K 3/389
(Continued)

(56) References Cited

U.S. PATENT DOCUMENTS 4,738,890 A * 4/1988 Tohrin .................... B29B 15/10
428/196
6,097,089 A * 8/2000 Gaku .................... H01L 21/481
257/675
(Continued)

FOREIGN PATENT DOCUMENTS

| CN | 1638957 A | 7/2005 |
| JP | 2003-283098 | 10/2003 |

(Continued)

OTHER PUBLICATIONS

International Search Report of PCT application No. PCT/JP2015/003396 dated Oct. 6, 2015.
(Continued)

*Primary Examiner* — Timothy J Thompson
*Assistant Examiner* — Rhadames Alonzo Miller
(74) *Attorney, Agent, or Firm* — Greenblum & Bernstein, P.L.C.

(57) ABSTRACT

A metal-clad laminate includes: a cured insulating layer including a polyphenylene ether compound; a metal layer joined with the insulating layer; and an intermediate layer interposed between the insulating layer and the metal layer, the intermediate layer including a silane compound. The metal layer has a junction surface that is joined with the insulating layer via the intermediate layer. The junction surface has a ten-point average roughness Rz ranging from 0.5 μm to 4 μm inclusive.

28 Claims, 2 Drawing Sheets

(51) Int. Cl.
*C08G 65/48* (2006.01)
*C08L 71/12* (2006.01)
*B32B 27/00* (2006.01)
*B32B 27/26* (2006.01)
*B32B 15/14* (2006.01)
*B32B 5/02* (2006.01)
*B32B 15/12* (2006.01)
*B32B 29/00* (2006.01)
*B32B 7/04* (2019.01)
*B32B 15/20* (2006.01)
*H05K 3/38* (2006.01)
*H05K 1/03* (2006.01)

(52) U.S. Cl.
CPC .............. *B32B 15/12* (2013.01); *B32B 15/14* (2013.01); *B32B 15/20* (2013.01); *B32B 27/00* (2013.01); *B32B 27/26* (2013.01); *B32B 29/002* (2013.01); *C08G 65/48* (2013.01); *C08G 65/485* (2013.01); *C08L 71/12* (2013.01); *H05K 3/389* (2013.01); *B32B 2250/03* (2013.01); *B32B 2250/40* (2013.01); *B32B 2260/021* (2013.01); *B32B 2260/023* (2013.01); *B32B 2260/028* (2013.01); *B32B 2260/046* (2013.01); *B32B 2262/0269* (2013.01); *B32B 2262/0276* (2013.01); *B32B 2262/062* (2013.01); *B32B 2262/101* (2013.01); *B32B 2307/204* (2013.01); *B32B 2307/306* (2013.01); *B32B 2307/538* (2013.01); *B32B 2307/748* (2013.01); *B32B 2457/08* (2013.01); *H05K 1/0326* (2013.01)

(58) Field of Classification Search
USPC ........................................................ 174/250
See application file for complete search history.

(56) References Cited

U.S. PATENT DOCUMENTS

| | | | | |
|---|---|---|---|---|
| 6,265,767 B1* | 7/2001 | Gaku | ................... | H01L 21/481 |
| | | | | 257/678 |
| 6,350,952 B1* | 2/2002 | Gaku | ................. | H01L 21/4857 |
| | | | | 174/522 |
| 2004/0146692 A1* | 7/2004 | Inoue | ...................... | B32B 15/14 |
| | | | | 428/141 |
| 2005/0042466 A1* | 2/2005 | Ohno | ................... | C08G 65/485 |
| | | | | 428/457 |
| 2005/0064159 A1* | 3/2005 | Amou | .................... | H05K 1/032 |
| | | | | 428/209 |
| 2005/0121229 A1* | 6/2005 | Takai | ..................... | B32B 15/08 |
| | | | | 174/261 |
| 2007/0169886 A1* | 7/2007 | Watanabe | ............... | B32B 15/08 |
| | | | | 156/325 |
| 2008/0254257 A1* | 10/2008 | Inoue | ..................... | B32B 15/14 |
| | | | | 428/141 |
| 2010/0015871 A1* | 1/2010 | Tanimoto | ................ | B32B 15/08 |
| | | | | 442/65 |
| 2010/0040874 A1* | 2/2010 | Narahashi | .............. | H05K 3/025 |
| | | | | 428/336 |
| 2010/0129676 A1* | 5/2010 | Fujimoto | ................ | B32B 15/14 |
| | | | | 428/462 |
| 2012/0206891 A1* | 8/2012 | Yoshioka | .......... | H01L 23/49811 |
| | | | | 361/783 |
| 2012/0329939 A1* | 12/2012 | Peters | .................... | C08G 65/48 |
| | | | | 524/505 |
| 2013/0037310 A1* | 2/2013 | Kimura | ...................... | C03J 5/24 |
| | | | | 174/251 |
| 2013/0213696 A1* | 8/2013 | Yamamoto | ............. | H05K 3/386 |
| | | | | 174/254 |
| 2013/0237648 A1* | 9/2013 | Peters | ....................... | C08L 1/10 |
| | | | | 524/35 |
| 2013/0274393 A1* | 10/2013 | Peters | ................... | C08L 25/06 |
| | | | | 524/188 |
| 2015/0004341 A1* | 1/2015 | Peters | ................ | C08G 18/4879 |
| | | | | 428/36.9 |
| 2015/0038610 A1* | 2/2015 | Peters | ....................... | C08J 9/08 |
| | | | | 521/175 |
| 2015/0045477 A1* | 2/2015 | Peters | ....................... | C08L 71/00 |
| | | | | 523/400 |
| 2015/0087736 A1* | 3/2015 | Peters | .................... | C08G 18/14 |
| | | | | 521/156 |

FOREIGN PATENT DOCUMENTS

| | | | |
|---|---|---|---|
| JP | 2004-140268 | | 5/2004 |
| JP | 2004-259899 | | 9/2004 |
| JP | 2005-015613 | | 1/2005 |
| JP | 2005015613 A | * | 1/2005 |
| JP | 2005-089691 | | 4/2005 |
| JP | 2006-516297 | | 6/2006 |
| JP | 2007-030326 | | 2/2007 |
| JP | 2008-260942 A | | 10/2008 |

OTHER PUBLICATIONS

Chinese Search Report dated Apr. 28, 2018 for related Chinese Patent Application No. 201580038577.4.

* cited by examiner

A

METAL-CLAD LAMINATE, METHOD FOR PRODUCING SAME, METAL FOIL WITH RESIN, AND PRINTED WIRING BOARD

CROSS-REFERENCE TO RELATED APPLICATIONS

This application is a U.S. national stage application of the PCT International Application No. PCT/JP2015/003396 filed on Jul. 7, 2015, which claims the benefit of foreign priority of Japanese patent application No. 2014-146142 filed on July 16, 2014, the contents all of which are incorporated herein by reference.

TECHNICAL FIELD

The present disclosure relates to a metal-clad laminate, a method for producing the same, a metal foil with resin, and a printed wiring board.

BACKGROUND

In recent years, in accordance with increase in information processing amount, a mounting technology such as achieving high integration of semiconductor devices, achieving high density of wiring, and achieving a multiple-layer structure is rapidly developing. In order to increase a signal transmission speed, it is demanded that a loss at a time of signal transmission of a printed wiring board used in various kinds of electronic devices is reduced. In order to satisfy this demand, it can be considered that a material having a low dielectric constant and a low dielectric loss tangent is used as a substrate material for an insulating layer of the printed wiring board.

Such a substrate material may be, for example, a polyphenylene ether resin composition.

Japanese Translation of PCT Publication No. 2006-516297 discloses a polyphenylene ether resin composition including a polyphenylene ether having an ethenylbenzyl group or a like group at a terminal and a cross-linking type curing agent.

SUMMARY

The present disclosure is directed to a metal-clad laminate with which a printed wiring board having a further reduced loss at the time of signal transmission can be produced, as well as a method for producing the same. Also, the present disclosure is directed to a metal foil with resin. Further, the present disclosure is directed to a printed wiring board that can be produced by using the metal-clad laminate. The metal-clad laminate of the present disclosure has a cured insulating layer including a polyphenylene ether compound, a metal layer joined with the insulating layer, and an intermediate layer interposed between the insulating layer and the metal layer. The intermediate layer includes a silane compound. The metal layer has a junction surface that is joined with the insulating layer via the intermediate layer. The junction surface has a ten-point average roughness Rz ranging from 0.5 μm to 4 μm inclusive. The production method of the present disclosure has a step of preparing an uncured insulating layer including a polyphenylene ether compound, a step of joining a metal layer with the uncured insulating layer, and a step of curing the uncured insulating layer to form a cured insulating layer. An intermediate layer including a silane compound is interposed between the cured insulating layer and the metal layer. The metal layer has a junction surface that is joined with the cured insulating layer via the silane compound. The junction surface has a ten-point average roughness Rz ranging from 0.5 μm to 4 μm inclusive. The metal foil with resin of the present disclosure has an uncured insulating layer including a polyphenylene ether compound, a metal layer joined with the insulating layer, and an intermediate layer interposed between the insulating layer and the metal layer. The intermediate layer includes a silane compound. The metal layer has a junction surface that is joined with the insulating layer via the intermediate layer. The junction surface has a ten-point average roughness Rz ranging from 0.5 μm to 4 μm inclusive. Further, the printed wiring board of the present disclosure has a cured insulating layer including a polyphenylene ether compound, a wiring joined with the insulating layer, and an intermediate layer interposed between the insulating layer and the wiring. The intermediate layer includes a silane compound. The wiring has a junction surface that is joined with the insulating layer via the intermediate layer. The junction surface has a ten-point average roughness Rz ranging from 0.5 μm to 4 μm inclusive.

Such a constitution enhances flatness and smoothness of the junction surface and enhances an adhesion property between the insulating layer and the metal layer. By improvement in this adhesion property, there can be provided a metal-clad laminate with which a printed wiring board having a further reduced loss at the time of signal transmission can be suitably produced. Also, there can be provided a metal foil with resin which has an excellent adhesion property and with which a printed wiring board having a further reduced loss at the time of signal transmission can be produced.

DESCRIPTION OF EMBODIMENTS

Prior to description of the exemplary embodiment of the present disclosure, problems in a conventional printed wiring board will be described.

In Japanese Translation of PCT Publication No. 2006-516297 described above, reduction of the loss occurring in the laminate at the time of signal transmission is insufficient. Therefore, in order to reduce the loss at the time of signal transmission in the printed wiring board, the present inventors have paid attention to the wiring formed on the insulating layer. Specifically, the present inventors have paid attention to the junction surface that is in contact with the insulating layer in the wiring formed on the insulating layer of the printed wiring board. The present inventors have considered that, by enhancing the flatness and smoothness of this junction surface, the loss at the time of signal transmission can be reduced even when the substrate material for producing the insulating layer is not changed. Therefore, the present inventors have studied on enhancement of the flatness and smoothness of the metal layer in the metal-clad laminate or in the metal foil with resin which is used for producing the printed wiring board.

However, simply enhancing the flatness and smoothness of the metal layer may decrease the adhesion property between the metal layer and the insulating layer. When the adhesion property decreases, a problem may be caused such that, particularly when the metal-clad laminate is formed into a printed wiring board, the wiring may be peeled off from the insulating layer, or a like.

Hereafter, the exemplary embodiment according to the present disclosure will be described. The present disclosure is not limited to contents described below. Further, a constitution of the present exemplary embodiment will be described below mainly with reference to the constitution of the metal-clad laminate among the metal-clad laminate, the metal foil with resin, and the printed wiring board of the present exemplary embodiment. At the time of this, the constitution of the present exemplary embodiment described below can be applied to the metal foil with resin and the printed wiring board in a similar manner.

Figure 1:
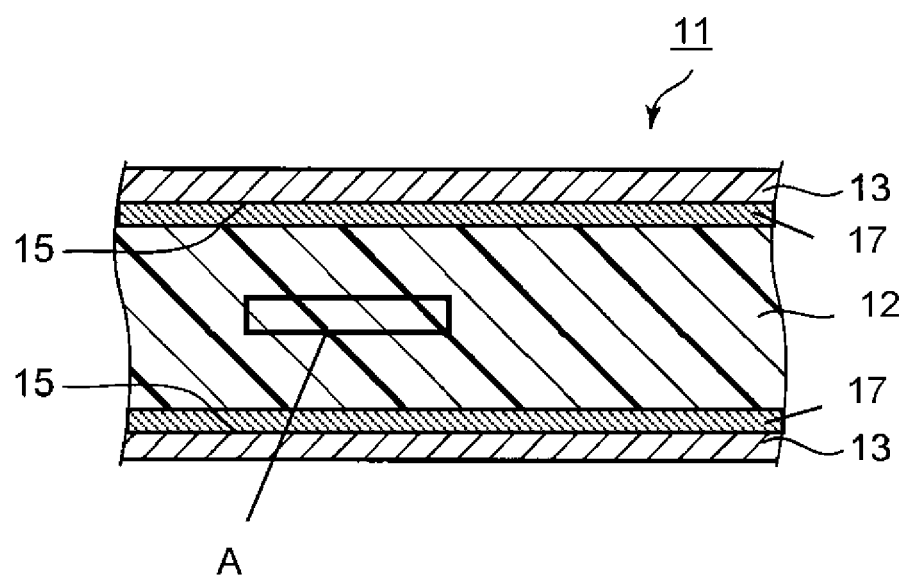
FIG. 1 is a sectional view illustrating a constitution of a metal-clad laminate according to an exemplary embodiment of the present disclosure.
Figure 2:
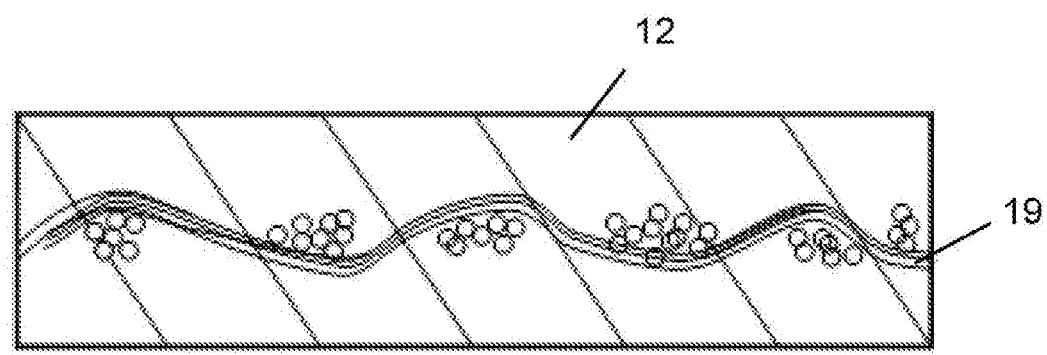
FIG. 2 is a sectional view enlarging a region A of an insulating layer in FIG. 1 according to the exemplary embodiment of the present disclosure.
Figure 3:
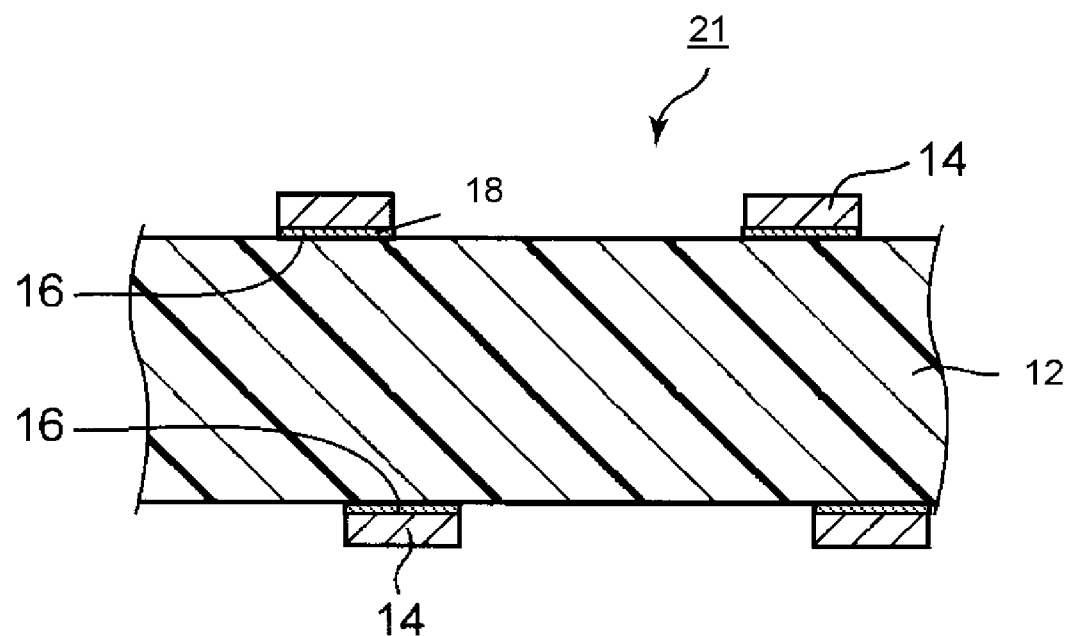
FIG. 3 is a sectional view illustrating a constitution of a printed wiring board according to the exemplary embodiment of the present disclosure.

FIG. 1 is a sectional view illustrating a constitution of metal-clad laminate 11 according to the present exemplary embodiment. FIG. 2 is a sectional view enlarging a region A of insulating layer 12 in FIG. 1 according to the present exemplary embodiment. Further, FIG. 3 is a sectional view illustrating a constitution of printed wiring board 21 according to the present exemplary embodiment.

Metal-clad laminate 11 has cured insulating layer 12, metal layer 13 joined with at least one surface of insulating layer 12, and intermediate layer 17, which includes a silane compound, interposed between insulating layer 12 and metal layer 13. Metal layer 13 has junction surface 15 that is joined with insulating layer 12 via intermediate layer 17. Also, metal-clad laminate 11 may have a constitution in which metal layer 13 has a contact onto only one surface of insulating layer 12.

Insulating layer 12 including a polyphenylene ether compound is a cured product. Insulating layer 12 includes a cured product of a thermosetting resin composition containing a modified polyphenylene ether having a functional group including a carbon-to-carbon unsaturated bond at a terminal and a curing agent having a carbon-to-carbon unsaturated bond in a molecule. The polyphenylene ether compound included in insulating layer 12 is constituted of the modified polyphenylene ether included in this thermosetting resin composition. The cured product included in insulating layer 12 is not particularly limited as long as the cured product is a product obtained by curing the thermosetting resin composition. Also, it is preferable that insulating layer 12 includes fibrous base material 19 in addition to the cured product of the thermosetting resin composition, from the viewpoint of enhancing strength, heat resistance, and the like. Specifically, an insulating layer obtained by impregnating fibrous base material 19 with the thermosetting resin composition and curing the thermosetting resin composition incorporated in fibrous base material 19, may be mentioned as an example.

Also, as described above, insulating layer 12 is the cured product of the thermosetting resin composition containing the modified polyphenylene ether and the curing agent, so that insulating layer 12 retains excellent dielectric properties that the polyphenylene ether has.

Also, intermediate layer 17 obtained by performing a surface treatment using a silane coupling agent having a carbon-to-carbon unsaturated bond in a molecule is formed on junction surface 15 of metal layer 13. Junction surface 15 has a ten-point average roughness Rz ranging from 0.5 μm to 4 μm inclusive.

Metal layer 13 is joined with insulating layer 12 via intermediate layer 17. Also, when printed wiring board 21 described later is produced from metal-clad laminate 11, this metal layer 13 is turned into wiring 14 in printed wiring board 21. Metal layer 13 that can be turned into this wiring 14 has junction surface 16 having a low ten-point average roughness Rz. For this reason, the flatness and smoothness of junction surface 16 is high. From this, it seems that, in printed wiring board 21 obtained from metal-clad laminate 11, the flatness and smoothness at an interface between insulating layer 12 and wiring 14 is high. For this reason, it seems that, in printed wiring board 21, a conductor loss caused by contact of wiring 14 with insulating layer 12 is reduced. Therefore, it seems that printed wiring board 21 having a further reduced loss at the time of signal transmission is obtained.

Further, intermediate layer 17 is disposed on junction surface 15 of metal layer 13 that is joined with insulating layer 12 by performing the surface treatment using the silane coupling agent having the carbon-to-carbon unsaturated bond in the molecule. For this reason, junction surface 15 of metal layer 13 has the carbon-to-carbon unsaturated bonds deriving from intermediate layer 17 and the silane coupling agent. It seems that the adhesion property of metal layer 13 to insulating layer 12 is enhanced by these carbon-to-carbon unsaturated bonds. Specifically, when the thermosetting resin composition is heated on metal layer 13 in producing metal-clad laminate 11, the carbon-to-carbon unsaturated bond that is present in the thermosetting resin composition and the carbon-to-carbon unsaturated bond that intermediate layer 17 has react with each other. Further, it seems that, by this reaction, the adhesion property between metal layer 13 and insulating layer 12 can be enhanced via intermediate layer 17. By enhancement of the adhesion property between intermediate layer 17 and insulating layer 12, the adhesion property between metal layer 13 and insulating layer 12 can be sufficiently retained even when the flatness and smoothness of junction surface 15 that is joined with insulating layer 12 is enhanced. Therefore, in printed wiring board 21 produced by using metal-clad laminate 11, peeling-off of the wiring from the insulating layer can be sufficiently suppressed. In other words, printed wiring board 21 can be suitably produced from metal-clad laminate 11.

From the above, printed wiring board 21 having a further reduced loss at the time of signal transmission can be suitably produced by using metal-clad laminate 11.

Also, the ten-point average roughness Rz of junction surface 15 in metal layer 13 is 4 μm or less, preferably 2.5 μm or less, more preferably 2 μm or less. In other words, it is preferable that the ten-point average roughness Rz of junction surface 15 is low. In other words, it is preferable that the flatness and smoothness of junction surface 15 is high in view of a fact that the loss at the time of signal transmission can be reduced as described above. Meanwhile, even when the ten-point average roughness Rz is lowered, the ten-point average roughness Rz of junction surface 15 has a lower limit of about 0.5 μm. Also, when a surface roughness of junction surface 15 is too low, the adhesion property between metal layer 13 and insulating layer 12 tends to decrease even when the surface treatment is performed. From this point as well, the ten-point average roughness Rz of metal layer 13 is preferably 0.5 μm or more. Therefore, the ten-point average roughness Rz of metal layer 13 is from 0.5 μm to 4 μm inclusive, preferably from 0.5 μm to 2.5 μm inclusive, more preferably from 0.5 μm to 2 μm inclusive.

Specifically, in order to set the ten-point average roughness Rz to be within a range described above, metal layer 13 may be subjected, for example, to a roughening treatment or a flattening and smoothening treatment.

Also, it is sufficient that the surface treatment is performed on at least one surface of metal layer 13. In other words, the surface treatment may be performed on both surfaces of metal layer 13 or on one surface of metal layer 13. In a case in which the surface treatment is performed on one surface of metal layer 13, metal layer 13 is disposed so that the surface subjected to the surface treatment is joined with insulating layer 12. In other words, the surface subjected to the surface treatment constitutes junction surface 15.

Also, the surface treatment is not particularly limited as long as the surface treatment is performed using a silane coupling agent having a carbon-to-carbon unsaturated bond in a molecule. The surface treatment may be carried out, for example, by a method of applying the silane coupling agent.

Also, the silane coupling agent is not particularly limited as long as the silane coupling agent has a carbon-to-carbon unsaturated bond in a molecule. Specifically, such a silane coupling agent may be, for example, a silane coupling agent having at least one kind of a functional group selected from the group consisting of styryl group, vinyl group, acryl group, and methacryl group. In other words, this silane coupling agent may be, for example, a compound having at least one of styryl group, vinyl group, acryl group, and methacryl group as a reactive functional group and having a hydrolyzable group such as methoxy group or ethoxy group.

Also, as metal layer 13, it is possible to use, for example, a metal foil such as a copper foil, or the like. A thickness of metal layer 13 may vary depending on a performance or the like that is demanded in eventually obtained printed wiring board 21 and is not particularly limited. Among these, the thickness of metal layer 13 is preferably, for example, from 12 μm to 70 μm inclusive. When the thickness is within this range, a handling property and a processability of metal layer 13 is improved.

Also, in the same manner as the thickness of metal layer 13, the thickness of insulating layer 12 may vary depending on a performance or the like that is demanded in the eventually obtained printed wiring board and is not particularly limited. Among these, the thickness of insulating layer 12 is preferably, for example, from 20 μm to 200 μm inclusive. When the thickness is within this range, an insulation property and a processability of insulating layer 12 is improved. Further, this facilitates adjustment of the thickness of the printed wiring board in finishing the printed wiring board.

As described above, insulating layer 12 includes a cured product of the thermosetting resin composition. As described above, this thermosetting resin composition contains a modified polyphenylene ether having a functional group that has a carbon-to-carbon unsaturated bond at a terminal and a curing agent having a carbon-to-carbon unsaturated bond in a molecule. Hereafter, components included in this thermosetting resin composition will be described.

This modified polyphenylene ether is not particularly limited as long as the modified polyphenylene ether is a polyphenylene ether having a terminal modified by a substituent having a carbon-to-carbon unsaturated bond. In other words, the functional group at the terminal of the above modified polyphenylene ether is, for example, a substituent having a carbon-to-carbon unsaturated bond that is obtained by terminal modification.

The substituent having a carbon-to-carbon unsaturated bond is not particularly limited. Examples of the substituent include substituents represented by the following formula (1) and the like.

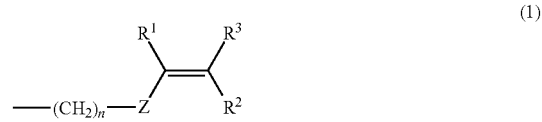

In the formula (1), n represents an integer ranging from 0 to 10 inclusive. Also, Z represents an arylene group. Also, $R^1$ to $R^3$ are each independent. In other words, $R^1$ to $R^3$ each may be a same group or a different group. Also, $R^1$ to $R^3$ each represent a hydrogen atom or an alkyl group.

Here, in the formula (1), the case in which n is equal to 0 shows that Z is directly bonded to the terminal of the polyphenylene ether.

The arylene group is not particularly limited. Specifically, the arylene group may be, for example, a monocyclic aromatic group such as a phenylene group, a polycyclic aromatic group which is polycyclic and aromatic such as a naphthalene ring, or the like. Also, examples of this arylene group include derivatives in which the hydrogen atom bonded to an aromatic ring is substituted with a functional group such as an alkenyl group, an alkynyl group, a formyl group, an alkylcarbonyl group, an alkenylcarbonyl group, or an alkynylcarbonyl group. Also, the alkyl group is not particularly limited, and is preferably, for example, an alkyl group having a carbon number ranging from 1 to 18 inclusive, more preferably an alkyl group having a carbon number ranging from 1 to 10 inclusive. Specific examples thereof include methyl group, ethyl group, propyl group, hexyl group, and decyl group.

More specific examples of the substituent include vinylbenzyl group (ethenylbenzyl group) such as p-ethenylbenzyl group or m-ethenylbenzyl group, and vinylphenyl group.

In particular, the functional group including the vinylbenzyl group may be specifically, for example, at least one substituent selected from the following formula (2) or formula (3), or the like.

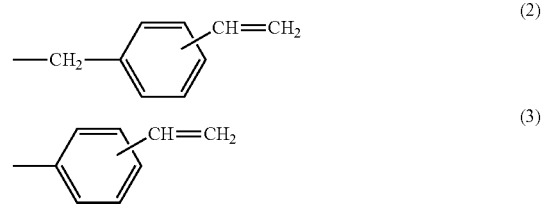

Examples of other substituents having a carbon-to-carbon unsaturated bond that are involved in terminal modification in the modified polyphenylene ether used in the present exemplary embodiment include acrylate group and methacrylate group, and are shown, for example, by the following formula (4).

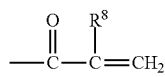
(4)

In the formula (4), $R^8$ represents a hydrogen atom or an alkyl group. The alkyl group is not particularly limited, and is preferably, for example, an alkyl group having a carbon number ranging from 1 to 18 inclusive, more preferably an alkyl group having a carbon number ranging from 1 to 10 inclusive. Specific examples thereof include methyl group, ethyl group, propyl group, hexyl group, and decyl group.

Also, the modified polyphenylene ether has a polyphenylene ether chain in a molecule, and preferably has, for example, a repeating unit represented by the following formula (5) in the molecule.

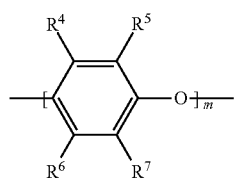
(5)

In the formula (5), m represents an integer ranging from 1 to 50 inclusive. Also, $R^4$ to $R^7$ are each independent. In other words, $R^4$ to $R^7$ each may be a same group or a different group. Also, $R^4$ to $R^7$ each represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

Specific examples of $R^4$ to $R^7$ are as follows.

The alkyl group is not particularly limited, and is preferably, for example, an alkyl group having a carbon number ranging from 1 to 18 inclusive, more preferably an alkyl group having a carbon number ranging from 1 to 10 inclusive. Specific examples thereof include methyl group, ethyl group, propyl group, hexyl group, and decyl group.

Also, the alkenyl group is not particularly limited, and is preferably, for example, an alkenyl group having a carbon number ranging from 2 to 18 inclusive, more preferably an alkenyl group having a carbon number ranging from 2 to 10 inclusive. Specific examples thereof include vinyl group, allyl group, and 3-butenyl group.

Also, the alkynyl group is not particularly limited, and is preferably, for example, an alkynyl group having a carbon number ranging from 2 to 18 inclusive, more preferably an alkynyl group having a carbon number ranging from 2 to 10 inclusive. Specific examples thereof include ethynyl group and prop-2-yn-1-yl group (propargyl group).

Also, the alkylcarbonyl group is not particularly limited as long as the alkylcarbonyl group is a carbonyl group substituted with an alkyl group, and is preferably, for example, an alkylcarbonyl group having a carbon number ranging from 2 to 18 inclusive, more preferably an alkylcarbonyl group having a carbon number ranging from 2 to 10 inclusive. Specific examples thereof include acetyl group, propionyl group, butyryl group, isobutyryl group, pivaloyl group, hexanoyl group, octanoyl group, and cyclohexylcarbonyl group.

Also, the alkenylcarbonyl group is not particularly limited as long as the alkenylcarbonyl group is a carbonyl group substituted with an alkenyl group, and is preferably, for example, an alkenylcarbonyl group having a carbon number ranging from 3 to 18 inclusive, more preferably an alkenylcarbonyl group having a carbon number ranging from 3 to 10 inclusive. Specific examples thereof include acryloyl group, methacryloyl group, and crotonoyl group.

Also, the alkynylcarbonyl group is not particularly limited as long as the alkynylcarbonyl group is a carbonyl group substituted with an alkynyl group, and is preferably, for example, an alkynylcarbonyl group having a carbon number ranging from 3 to 18 inclusive, more preferably an alkynylcarbonyl group having a carbon number ranging from 3 to 10 inclusive. Specific examples thereof include propioloyl group.

A weight-average molecular weight (Mw) of the modified polyphenylene ether is not particularly limited. Specifically, the weight-average molecular weight is preferably from 500 to 4000 inclusive, more preferably from 800 to 4000 inclusive, and still more preferably from 1000 to 3000 inclusive. Here, the weight-average molecular weight may be measured by a general molecular weight measurement method. Specifically, the weight-average molecular weight may be, for example, a value obtained by measurement using gel permeation chromatography (GPC). Also, when the modified polyphenylene ether has a repeating unit represented by the formula (2) in the molecule, m is preferably a numerical value by which the weight-average molecular weight of the modified polyphenylene ether falls within such a range. Specifically, m is preferably from 1 to 50 inclusive.

When the weight-average molecular weight of the modified polyphenylene ether is within such a range, metal-clad laminate 11 has excellent dielectric properties that the polyphenylene ether has, and is more excellent not only in heat resistance of the cured product of the thermosetting resin composition but also in moldability. This seems to be due to following reasons. When the weight-average molecular weight of an ordinary polyphenylene ether is within such a range, the heat resistance of the cured product tends to decrease because the molecular weight is comparatively low. In contrast, it seems that, because the modified polyphenylene ether has one or more unsaturated bonds at the terminal, the cross-linking density is improved, and the heat resistance of the cured product is sufficiently enhanced. Also, when the weight-average molecular weight of the modified polyphenylene ether is within such a range, the cured product is excellent in moldability because the molecular weight is comparatively low. Therefore, it seems that such a modified polyphenylene ether not only improves the heat resistance of the cured product but also improves the moldability.

Also, an average number of substituents (number of terminal functional groups) that one molecule of the modified polyphenylene ether has at the terminals of the molecule is not particularly limited. Specifically, the number is preferably from 1 to 5 inclusive, more preferably from 1 to 3 inclusive, and still more preferably from 1.5 to 3 inclusive. When the number of terminal functional groups is too small, the heat resistance of the cured product tends to be insufficient. Also, when the number of terminal functional groups is too large, reactivity becomes too high, thereby causing that, for example, a storage property of the thermosetting resin composition may decrease, or a fluidity of the thermosetting resin composition may decrease. In other words, when such a modified polyphenylene ether is used, there is a possibility that, by insufficient fluidity or the like, poor molding may occur such as generation of voids at the time of molding multiple layers, thereby making it difficult to obtain printed wiring board 21 having a high reliability.

Here, the number of terminal functional groups in the modified polyphenylene ether compound may be, for example, a numerical value representing an average value of substituents per one molecule of all of the modified polyphenylene ether that is present in one mole of the modified polyphenylene ether. This number of terminal functional groups can be determined, for example, by measuring the number of hydroxyl groups that remain in the obtained modified polyphenylene ether and calculating an amount of decrease in the number from the number of hydroxyl groups that are in the polyphenylene ether before modification. This amount of decrease in the number from the number of hydroxyl groups that are in the polyphenylene ether before modification is the number of terminal functional groups. Further, the number of hydroxyl groups that remain in the modified polyphenylene ether can be determined by adding a quaternary ammonium salt (tetraethylammonium hydroxide) that associates with hydroxyl groups into a solution of the modified polyphenylene ether and measuring a UV absorbancy of a mixture solution thereof.

Also, an intrinsic viscosity of the modified polyphenylene ether is not particularly limited. Specifically, the intrinsic viscosity may be sufficiently from 0.03 dl/g to 0.12 dl/g, preferably from 0.04 dl/g to 0.11 dl/g, more preferably from 0.06 dl/g to 0.095 dl/g. When this intrinsic viscosity is too low, the molecular weight tends to be small, giving rise to a tendency such that it is difficult to obtain low dielectric properties such as a low dielectric constant and a low dielectric loss tangent. Also, when the intrinsic viscosity is too high, the viscosity tends to be high, and a sufficient fluidity cannot be obtained, whereby the moldability of the cured product tends to decrease. Therefore, when the intrinsic viscosity of the modified polyphenylene ether is within the above-described range, an excellent heat resistance and moldability of the cured product can be realized.

Here, the intrinsic viscosity as herein referred to is an intrinsic viscosity that is measured in methylene chloride of 25° C., and more specifically is, for example, a value obtained by measurement of 0.18 g/45 ml methylene chloride solution (liquid temperature of 25° C.) with a viscometer. A capillary type viscometer is used as this viscometer. The viscometer may be, for example, AVS500 Visco System manufactured by Schott AG.

Also, the curing agent is not particularly limited as long as the curing agent has a carbon-to-carbon unsaturated bond in a molecule. The curing agent preferably includes a cross-linking type curing agent that can react with the modified polyphenylene ether to cure insulating layer 12 by forming a cross link. This cross-linking type curing agent is preferably a compound having two or more carbon-to-carbon unsaturated bonds in a molecule.

Also, the cross-linking type curing agent preferably has a weight-average molecular weight ranging from 100 to 5000 inclusive, more preferably from 100 to 4000 inclusive, and still more preferably from 100 to 3000 inclusive. When the weight-average molecular weight of the cross-linking type curing agent is too low, there is a possibility that the cross-linking type curing agent may be volatilized from a blended component system of the thermosetting resin composition. Also, when the weight-average molecular weight of the cross-linking type curing agent is too high, there is a possibility that the viscosity of the thermosetting resin composition or a melt viscosity at the time of heat-molding may become too high. Therefore, when the weight-average molecular weight of the cross-linking type curing agent is within such a range, a thermosetting resin composition, which can form a cured product having a more excellent heat resistance, is obtained. The curing agent such as described above can suitably form the cross link by reaction with the modified polyphenylene ether. For this reason, the heat resistance seems to be improved. Here, the weight-average molecular weight may be one measured by a general molecular weight measurement method. Specifically, the weight-average molecular weight may be, for example, a value measured using gel permeation chromatography (GPC).

Also, regarding the cross-linking type curing agent, an average number of carbon-to-carbon unsaturated bonds (number of terminal double bonds) per one molecule of the cross-linking type curing agent differs depending on the weight-average molecular weight of the cross-linking type curing agent and the like. The number of terminal double bonds may be, for example, preferably from 1 to 20 inclusive, more preferably from 2 to 18 inclusive. When this number of terminal double bonds is too small, the heat resistance of the cured product tends to be insufficient. Also, when the number of terminal double bonds is too large, the reactivity of the curing agent becomes too high. This generates an inconvenience such as decrease in the storage property of the thermosetting resin composition or decrease in the fluidity of the thermosetting resin composition, raising a fear that the moldability of the obtained cured product may decrease.

Also, the number of terminal double bonds of the cross-linking type curing agent is preferably from 1 to 4 inclusive in the case in which the weight-average molecular weight of the cross-linking type curing agent is less than 500 (for example, 100 or more and less than 500). Also, the number of terminal double bonds of the cross-linking type curing agent is preferably from 3 to 20 inclusive in the case in which the weight-average molecular weight of the cross-linking type curing agent is 500 or more (for example, from 500 to 5000 inclusive). When the number of terminal double bonds in each case is smaller than a lower limit value of the above-described range, the reactivity of the cross-linking type curing agent decreases, and a cross-linking density of the cured product of the thermosetting resin composition decreases, thereby raising a possibility that the heat resistance or Tg cannot be sufficiently improved. Meanwhile, when the number of terminal double bonds is larger than an upper limit value of the above-described range, there is a possibility that the thermosetting resin composition may become liable to be gelified.

Here, the number of terminal double bonds as herein referred to can be found out from a standard value of a product of the cross-linking type curing agent that is put to use. Specifically, the number of terminal double bonds here may be, for example, a numerical value representing an average value of the number of double bonds per one molecule of all of the cross-linking type curing agent that is present in one mole of the cross-linking type curing agent. Also, preferable examples of the curing agent include styrene, divinylbenzene, acrylate compounds, methacrylate compounds, trialkenyl isocyanurate compounds, and polybutadiene. Also, as described above, the curing agent preferably includes a cross-linking type curing agent. Specific examples of this cross-linking type curing agent include trialkenyl isocyanurate compounds such as triallyl isocyanurate (TAIC), polyfunctional methacrylate compounds having two or more methacryl groups in a molecule, polyfunctional acrylate compounds having two or more acryl groups in a molecule, vinyl compounds having two or more vinyl groups in a molecule (polyfunctional vinyl compounds) such as polybutadiene, and vinylbenzyl compounds having a vinylbenzyl group in a molecule, such as styrene and divinylbenzene. Among these, compounds having two or more carbon-to-carbon double bonds in a molecule are preferable. Specific examples thereof include trialkenyl isocyanurate compounds, polyfunctional acrylate compounds, polyfunctional methacrylate compounds, polyfunctional vinyl compounds, and divinylbenzyl compounds. It seems that, when these are used, the cross link is more suitably formed by a curing reaction, whereby the heat resistance of the cured product of the thermosetting resin composition can be further enhanced. Also, regarding the cross-linking type curing agent, the exemplified cross-linking type curing agents may be used either singly or as a combination of two or more kinds thereof. Also, as the cross-linking type curing agent, a compound having two or more carbon-to-carbon unsaturated bonds in a molecule and a compound having one carbon-to-carbon unsaturated bond in a molecule may be combined for use. The compound having one carbon-to-carbon unsaturated bond in a molecule may be specifically, for example, a compound having one vinyl group in a molecule (monovinyl compound) such as styrene.

Also, a content of the modified polyphenylene ether is preferably from 30 parts by mass to 90 parts by mass, more preferably from 50 parts by mass to 90 parts by mass, relative to 100 parts by mass of a sum amount of the modified polyphenylene ether and the curing agent. Also, a content of the curing agent is preferably from 10 parts by mass to 70 parts by mass, more preferably from 10 parts by mass to 50 parts by mass, relative to 100 parts by mass of a sum amount of the modified polyphenylene ether and the curing agent. In other words, a content ratio of the modified polyphenylene ether and the curing agent is preferably from 90:10 to 30:70, more preferably from 90:10 to 50:50 in a mass ratio. When the content of each of the modified polyphenylene ether and the curing agent is a content that satisfies the above ratio, a curing reaction between the modified polyphenylene ether and the curing agent suitably proceeds. For this reason, a thermosetting resin composition is obtained achieving more excellent heat resistance and flame retardancy of the cured product.

Also, the thermosetting resin composition may be made of the modified polyphenylene ether and the curing agent; however, the thermosetting resin composition may further contain other components as long as the thermosetting resin composition contains the modified polyphenylene ether and the curing agent. Examples of the other components include a flame retardant, a filler, an additive, and a reaction initiator.

The flame retardant is added for the purpose of enhancing the flame retardancy of the cured product of the thermosetting resin composition; however, a material thereof is not particularly limited. The flame retardant may be, for example, a halogen-based flame retardant such as a bromine-based flame retardant or a phosphorus-based flame retardant. Specific examples of the halogen-based flame retardant include bromine-based flame retardants such as pentabromodiphenyl ether, octabromodiphenyl ether, decabromodiphenyl ether, tetrabromobisphenol A, and hexabromocyclododecane, and chlorine-based flame retardants such as chlorinated paraffin. Also, specific examples of the phosphorus-based flame retardant include phosphates such as condensed phosphates and cyclic phosphates, phosphazene compounds such as cyclic phosphazene compounds, phosphinate-based flame retardants such as metal salts of phosphinic acid such as aluminum dialkylphosphinate, and melamine-based flame retardants such as melamine phosphate and melamine polyphosphate. Regarding the flame retardant, the exemplified flame retardants may be used either singly or as a combination of two or more kinds thereof.

Also, the filler is added for the purpose of enhancing heat resistance and flame retardancy of the cured product of the thermosetting resin composition; however, a material thereof is not particularly limited. Also, by incorporating the filler, heat resistance, flame retardancy, and the like can be further enhanced. Specific examples of the filler include silica such as spherical silica, metal oxides such as alumina, titanium oxide, and mica, metal hydroxides such as aluminum hydroxide and magnesium hydroxide, talc, aluminum borate, barium sulfate, and calcium carbonate. Also, among these, the filler is preferably silica, mica, or talc, more preferably spherical silica. Also, the fillers may be used either singly as one kind or in combination of two or more kinds. Also, the filler may be used as it is; however, the filler may be subjected to a surface treatment in advance before being used. This surface treatment is not particularly limited; however, a surface treatment similar to the surface treatment carried out on metal layer 13 in the present exemplary embodiment may be mentioned as an example. Specifically, a surface treatment using a silane coupling agent having a carbon-to-carbon unsaturated bond in a molecule may be mentioned as an example. Also, examples of this silane coupling agent include silane coupling agents having at least one kind of a functional group selected from the group consisting of styryl group, vinyl group, acryl group, and methacryl group.

Also, when the filler is contained, the content thereof is preferably from 10 parts by mass to 200 parts by mass, more preferably from 30 parts by mass to 150 parts by mass, relative to 100 parts by mass of a sum amount of organic components (excluding the flame retardant) and the flame retardant.

Also, examples of the additive include antifoaming agents such as silicone-based antifoaming agents and acrylate-based antifoaming agents, thermostabilizers, antistatic agents, ultraviolet absorbers, dyes and pigments, lubricants, and dispersants such as wet dispersants.

Also, as described above, the thermosetting resin composition may contain a reaction initiator. Even when the thermosetting resin composition does not contain a reaction initiator, curing reaction of the modified polyphenylene ether can proceed. However, depending on processing conditions, there may be cases in which it is difficult to heat up to a temperature at which the curing reaction proceeds, so that the reaction initiator may be added. The reaction initiator is not particularly limited as long as the reaction initiator can promote the curing reaction of the modified polyphenylene ether. Specific examples of the reaction initiator include oxidizing agents such as $\alpha,\alpha'$-bis(t-butylperoxy-m isopropyl)benzene, 2,5-dimethyl-2,5-di(t-butylperoxy)-3-hexyne, benzoyl peroxide, 3,3',5,5'-tetramethyl-1,4-diphenoquinone, chloranyl, 2,4,6-tri-t-butylphenoxyl, t-butylperoxyisopropyl monocarbonate, and azobisisobutyronitrile. Also, in accordance with needs, a metal salt of carboxylic acid and the like may be used in combination. By combined use, the curing reaction can be further promoted. Among these, $\alpha,\alpha'$-bis(t-butylperoxy-m-isopropyl)benzene is preferably used. $\alpha,\alpha'$-bis(t-butylperoxy-m-isopropyl)benzene has a comparatively high reaction starting temperature. For this reason, promotion of the curing reaction can be suppressed at a time point at which there is no need to cure, such as the time of prepreg drying, and decrease in the storage property of the polyphenylene ether resin composition can be suppressed. Further, α,α'-bis(t-butylperoxy-m-isopropyl)benzene has a low volatility and hence is not volatilized at the time of prepreg drying or at the time of storage, thereby providing a good stability. Also, the reaction initiator may be used either singly or as a combination of two or more kinds.

In producing a prepreg, the thermosetting resin composition may be prepared in a varnish form for the purpose of impregnating a base material (fibrous base material 19) for forming the prepreg. In other words, it may be supposed that the thermosetting resin composition is typically prepared in a varnish form. Such a thermosetting resin composition in a varnish form can be prepared, for example, as follows.

First, components that can be dissolved into an organic solvent, such as the modified polyphenylene ether and the curing agent, are put into the organic solvent and dissolved. During this time, heating may be carried out in accordance with the needs. Thereafter, components that will not be dissolved in the organic solvent, which are used in accordance with the needs, are added and dispersed with use of a ball mill, a beads mill, a planetary mixer, a roll mill, or the like until a predetermined dispersion state is attained, thereby to prepare a composition in a varnish form. The components that will not be dissolved in the organic solvent may be, for example, an inorganic filler. The organic solvent that is used here is not particularly limited as long as the organic solvent can dissolve the modified polyphenylene ether compound, the curing agent, and others and does not inhibit the curing reaction. Specific examples of the organic solvent include toluene and methyl ethyl ketone (MEK).

Also, a prepreg may be formed by impregnating fibrous base material 19 with the thermosetting resin composition. In other words, insulating layer 12 in metal-clad laminate 11 according to the exemplary embodiment of the present disclosure may be formed by curing the prepreg that has been obtained by impregnating the fibrous base material with the thermosetting resin composition. A method of producing the prepreg such as this may be, for example, a method of drying after fibrous base material 19 is impregnated with the resin composition prepared in the varnish form.

Specific examples of fibrous base material 19 that is used in producing the prepreg include glass cloth, aramid cloth, polyester cloth, glass non-woven cloth, aramid non-woven cloth, polyester non-woven cloth, pulp paper, and linter paper. Here, when glass cloth is used, a laminate being excellent in mechanical strength is obtained and, in particular, a glass cloth processed by a flattening treatment is preferable. The flattening treatment processing can be carried out specifically, for example, by continuously pressurizing a glass cloth under a suitable pressure with use of a press roll and compressing a yarn into a flattened shape. Here, the thickness of fibrous base material 19 that can be generally used may be, for example, from 0.02 mm to 0.3 mm inclusive.

Fibrous base material 19 is impregnated with the thermosetting resin composition by immersion, application, or the like. This impregnation can be repeated for a plurality of times in accordance with the needs. Also, during this time, impregnation may be repeated by using a plurality of resin compositions having different compositions or concentrations, so as to make an adjustment to a composition and an impregnation amount that are eventually desired.

Fibrous base material 19 impregnated with the thermosetting resin composition is heated under desired heating conditions, for example, at 80° C. to 180° C. for one to ten minutes, whereby a prepreg in a semi-cured state (B stage) is obtained.

In a method for producing metal foil 11 with resin according to the present exemplary embodiment, uncured insulating layer 12 including a polyphenylene ether compound is prepared. Further, insulating layer 12 is joined with metal layer 13. Intermediate layer 17 including a silane compound intervenes between insulating layer 12 and metal layer 13. Metal layer 13 has junction surface 15 that is joined with the insulating layer via intermediate layer 17, and junction surface 15 has a ten-point average roughness Rz ranging from 0.5 μm to 4 μm inclusive. Other conditions are not particularly limited as long as the above-described metal-clad laminate can be produced by this method.

This production method may be, for example, a method for producing the metal-clad laminate by using the prepreg obtained in the above-described manner. More specifically, this production method may be, for example, a method of superposing one sheet or a plurality of sheets of this prepreg, further superposing a metal layer such as described above onto one surface or both surfaces located thereabove and therebelow, and integrating this laminate by heating and pressurizing molding. The heating and pressurizing conditions during this time can be suitably set in accordance with the thickness of metal-clad laminate 11 that is produced, the kind of the resin composition of the prepreg, and the like. Also, for example, the temperature can be set to be from 170° C. to 210° C.; the pressure can be set to be from 1.5 MPa to 4.0 MPa; and the time can be set to be 60 minutes to 150 minutes. By this process, metal-clad laminate 11 having insulating layer 12 obtained by curing the thermosetting resin composition can be fabricated.

Here, the method for producing metal-clad laminate 11 is not limited besides the above-described method of producing the metal-clad laminate by superposing the prepreg including fibrous base material 19 described above onto junction surface 15. The method for producing the metal-clad laminate may also be, for example, a method of applying the thermosetting composition in the varnish form described above onto junction surface 15 and curing the thermosetting composition in the varnish form by heating as insulating layer 12.

Printed wiring board 21 is fabricated by partially removing metal layer 13 from metal-clad laminate 11 to form wiring 14. In other words, printed wiring board 21 has insulating layer 12 and wiring 14 that has been formed by partially removing metal layer 13, as shown in FIG. 3. In wiring 14, junction surface 16 to insulating layer 12 retains junction surface 15 of metal-clad laminate 11. Also, intermediate layer 18 that intervenes between insulating layer 12 and metal layer 13 retains intermediate layer 17 of metal-clad laminate 11. For this reason, this printed wiring board 21 has excellent dielectric properties, and occurrence of peeling-off of wiring 14 is sufficiently suppressed. Further, a method for producing printed wiring board 21 is not particularly limited as long as the above-described printed wiring board can be produced. Specifically, by performing an etching treatment or the like on metal layer 13 on the surface of metal-clad laminate 11 to form wiring 14, printed wiring board 21 can be obtained in which a conductor pattern is disposed as wiring 14 on the surface of insulating layer 12.

Figure 4:
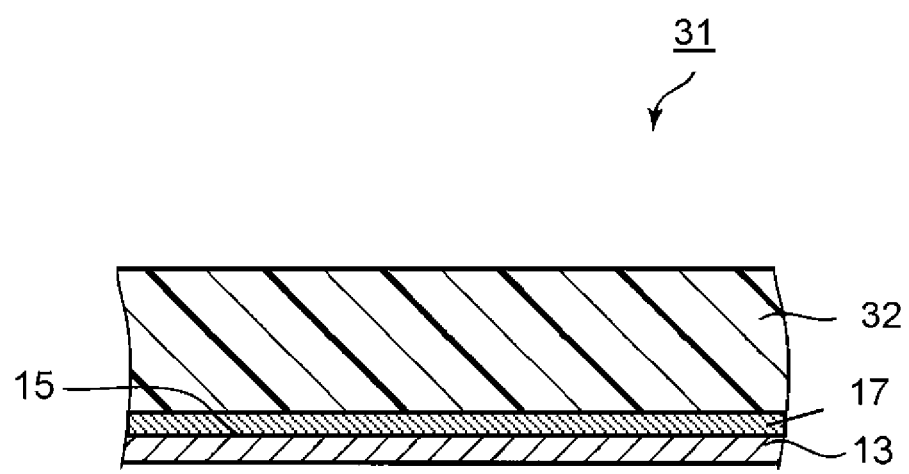
FIG. 4 is a sectional view illustrating a constitution of a metal foil with resin according to the exemplary embodiment of the present disclosure.

FIG. 4 is a sectional view illustrating a constitution of metal foil with resin 31 according to the present exemplary embodiment.

Metal foil with resin 31 has uncured insulating layer 32, metal layer 13 joined with one surface of insulating layer 32, and intermediate layer 17 interposed between insulating layer 32 and metal layer 13 and including a silane compound. Metal layer 13 has junction surface 15 that is joined with insulating layer 32 via intermediate layer 17.

The same thermosetting resin composition and curing agent as in insulating layer 12 of metal-clad laminate 11 can be used for insulating layer 32. Intermediate layer 17 of metal-clad laminate 11 can be used as intermediate layer 17. Metal layer 13 of metal-clad laminate 11 can be used as metal layer 13. Junction surface 15 has a ten-point average roughness ranging from 0.5 μm to 4 μm inclusive in the same manner as in metal-clad laminate 11.

By producing a printed wiring board with use of metal foil with resin 31, it is possible to provide a printed wiring board having a further reduced loss at the time of signal transmission in a state in which an adhesion property between the wiring and the insulating layer is retained.

Metal foil with resin 31 is produced, for example, by applying the above-described thermosetting resin composition in the varnish form onto metal layer 13 and heating. The thermosetting resin composition in the varnish form is applied onto metal layer 13 by using, for example, a bar coater. The applied thermosetting resin composition is heated, for example, under conditions ranging from 80° C. to 180° C. inclusive and from one minute to ten minutes inclusive. The heated thermosetting resin composition is formed as uncured insulating layer 32 on junction surface 15 of metal layer 13.

Also, as a method for producing printed wiring board 21, there can be mentioned a method for producing printed wiring board 21 by using metal foil with resin 31 besides the method of producing printed wiring board 21 by using metal-clad laminate 11 described above. As a method for producing the printed wiring board by using metal foil with resin 31, there can be mentioned a method of using metal foil with resin 31 by bonding metal foil with resin 31 onto a resin substrate on which a wiring has been formed, and a method of using metal foil with resin 31 by superposing a plurality of metal foils with resin. At this time, uncured insulating layer 32 is cured by being heated. Further, a wiring (not illustrated in the drawings) is formed from metal layer 13 by removing a part of metal layer 13.

As described above, the present specification discloses techniques of various modes. Principal techniques among these will be summarized as follows.

A metal-clad laminate according to one mode of the present disclosure comprises a cured insulating layer including a polyphenylene ether compound, a metal layer joined with the insulating layer, and an intermediate layer interposed between the insulating layer and the metal layer and including a silane compound. The metal layer has a junction surface that is joined with the insulating layer via the intermediate layer, and the junction surface has a ten-point average roughness Rz ranging from 0.5 μm to 4 μm inclusive. At this time, it is preferable that the insulating layer is obtained by heating a thermosetting resin composition, and the thermosetting resin composition contains a modified polyphenylene ether having a functional group including a carbon-to-carbon unsaturated bond at a terminal and a curing agent including a carbon-to-carbon unsaturated bond. Further, it is preferable that the silane compound of the intermediate layer has been obtained by performing a surface treatment on the junction surface by using a silane coupling agent including a carbon-to-carbon unsaturated bond.

According to such a constitution, it is possible to provide a metal-clad laminate with which a printed wiring board having a further reduced loss at the time of signal transmission can be suitably produced.

Also, in the metal-clad laminate, it is preferable that the silane coupling agent has at least one kind of a functional group selected from the group consisting of styryl group, vinyl group, acryl group, and methacryl group.

According to such a constitution, the adhesion property between the metal layer and the insulating layer can be further enhanced. Therefore, a metal-clad laminate is obtained that can produce a printed wiring board in which occurrence of peeling-off of the wiring is further suppressed.

Also, in the metal-clad laminate, the junction surface preferably has a ten-point average roughness Rz ranging from 0.5 μm to 2.5 μm inclusive.

When the ten-point average roughness Rz of the junction surface is low in this manner, the adhesion property between the metal layer and the insulating layer tends to decrease too much, though it can be expected that the loss at the time of signal transmission in the obtained printed wiring board is further reduced. Even when this tendency is present, the metal-clad laminate according to one mode of the present disclosure can sufficiently ensure the adhesion property between the metal layer and the insulating layer. Therefore, a metal-clad laminate is obtained that can produce a printed wiring board in which the loss at the time of signal transmission is further reduced while sufficiently ensuring the adhesion property between the wiring and the insulating layer.

Also, in the metal-clad laminate, it is preferable that the functional group at the terminal of the modified polyphenylene ether is at least one kind selected from the group consisting of vinylbenzyl group, vinyl group, acrylate group, and methacrylate group.

According to such a constitution, it is possible to obtain a metal-clad laminate that is provided with a suitable insulating layer being more excellent in heat resistance and the like while retaining the excellent dielectric properties that the polyphenylene ether has.

Also, in the metal-clad laminate, it is preferable that the curing agent is at least one kind selected from the group consisting of styrene, divinylbenzene, an acrylate compound, a methacrylate compound, a trialkenyl isocyanurate compound, and polybutadiene.

According to such a constitution, it is possible to obtain a metal-clad laminate that is provided with a suitable insulating layer being more excellent in heat resistance and the like while retaining the excellent dielectric properties that the polyphenylene ether has.

Also, in the metal-clad laminate, it is preferable that the modified polyphenylene ether has a weight-average molecular weight ranging from 500 to 4000 inclusive.

According to such a constitution, it is possible to obtain a metal-clad laminate that is provided with a suitable insulating layer being more excellent in heat resistance and the like while retaining the excellent dielectric properties that the polyphenylene ether has.

Also, in the metal-clad laminate, it is preferable that the insulating layer includes a fibrous base material.

According to such a constitution, it is possible to obtain a metal-clad laminate that is provided with a suitable insulating layer being more excellent in heat resistance and the like.

Also, a metal foil with resin according to one mode of the present disclosure comprises an uncured insulating layer including a polyphenylene ether compound, a metal layer joined with the insulating layer, and an intermediate layer interposed between the insulating layer and the metal layer and including a silane compound. The metal layer has a junction surface that is joined with the insulating layer via the intermediate layer, and the junction surface has a ten-point average roughness Rz ranging from 0.5 μm to 4 μm inclusive. At this time, it is preferable that the insulating layer is obtained by heating a thermosetting resin composition, and the thermosetting resin composition contains a modified polyphenylene ether having a functional group including a carbon-to-carbon unsaturated bond at a terminal and a curing agent including a carbon-to-carbon unsaturated bond. Further, it is preferable that the silane compound of the intermediate layer has been obtained by performing a surface treatment on the junction surface by using a silane coupling agent including a carbon-to-carbon unsaturated bond.

According to such a constitution, it is possible to provide a metal foil with resin that can produce a printed wiring board in which the adhesion property between the insulating layer and the metal layer is excellent, and the loss at the time of signal transmission is further reduced.

Also, a method for producing a metal-clad laminate according to one mode of the present disclosure comprises the steps of preparing an uncured insulating layer including a polyphenylene ether compound, joining a metal layer with the uncured insulating layer, and curing the uncured insulating layer to form a cured insulating layer, wherein an intermediate layer including a silane compound is interposed between the cured insulating layer and the metal layer; the metal layer has a junction surface that is joined with the cured insulating layer via the intermediate layer; and the junction surface has a ten-point average roughness Rz ranging from 0.5 μm to 4 μm inclusive. At this time, it is preferable that the uncured insulating layer includes a thermosetting resin composition, and the thermosetting resin composition contains a modified polyphenylene ether having a functional group including a carbon-to-carbon unsaturated bond at a terminal and a curing agent including a carbon-to-carbon unsaturated bond. Further, it is preferable that the silane compound of the intermediate layer is obtained by performing a surface treatment on the junction surface by using a silane coupling agent including a carbon-to-carbon unsaturated bond.

According to such a method, it is possible to produce a metal-clad laminate that can produce a printed wiring board and a metal-clad laminate in which the loss at the time of signal transmission is further reduced.

Also, a printed wiring board according to another one mode of the present disclosure comprises a cured insulating layer including a polyphenylene ether compound, a wiring joined with the insulating layer, and an intermediate layer interposed between the insulating layer and the wiring and including a silane compound. The wiring has a junction surface that is joined with the insulating layer via the intermediate layer, and the junction surface has a ten-point average roughness Rz ranging from 0.5 μm to 4 μm inclusive.

According to such a constitution, a printed wiring board is obtained which has excellent dielectric properties and in which the occurrence of peeling-off of the wiring is sufficiently suppressed.

Hereafter, the present disclosure will be more specifically described by way of Examples of the metal-clad laminate of the present disclosure; however, a scope of the present disclosure is not limited to these.

EXAMPLES

Examples 1 to 5 and Comparative Examples 1 to 4

First, components used in preparing the thermosetting resin composition in the Examples will be described.
(Polyphenylene ether: PPE component)
Modified Polyphenylene Ether 1 (Modified PPE-1):

A modified polyphenylene ether which has been synthesized in the following manner and in which a terminal hydroxyl group of a polyphenylene ether has been modified with a vinylbenzyl group (VB group, also referred to as ethenylbenzyl group) is used.

The modified PPE-1 is obtained by allowing polyphenylene ether to react with chloromethylstyrene. Specifically, the modified PPE-1 is obtained by the following reaction.

First, a one-liter three-neck flask having a thermoregulator, a stirring device, a cooling equipment, and a dropping funnel is loaded with 200 g of polyphenylene ether having a structure shown in the above formula (5), 30 g of a mixture of p-chloromethylstyrene and m-chloromethylstyrene in a mass ratio of 50:50, 1.227 g of tetra-n-butylammonium bromide as a phase transfer catalyst, and 400 g of toluene, followed by stirring. The above polyphenylene ether is SA90 manufactured by SABIC Innovative Plastics Japan LLC., and has an intrinsic viscosity (IV) of 0.083 dl/g with the number of terminal hydroxyl groups being 2 and with a weight-average molecular weight Mw of 1700. The above mixture of p-chloromethylstyrene and m-chloromethylstyrene is chloromethylstyrene (CMS) manufactured by Tokyo Chemical Industry Co., Ltd. Further, the stirring is carried out until polyphenylene ether, chloromethylstyrene, and tetra-n-butylammonium bromide are dissolved into toluene. During this process, heating is gradually carried out, and the heating is carried out until a liquid temperature eventually becomes 75° C. Further, into this solution, an aqueous solution of sodium hydroxide (20 g of sodium hydroxide/20 g of water) is dropwise added in 20 minutes as a hydroxide of an alkali metal. Thereafter, stirring is further carried out at 75° C. for 4 hours. Subsequently, after the contents in the flask are neutralized with hydrochloric acid of 10% by mass, a large amount of methanol is put into the flask. This process produces a precipitate in the liquid within the flask. In other words, the product contained in a reaction liquid within the flask is re-precipitated. Further, this precipitate is taken out by filtration, washed with a mixture liquid of methanol and water in a mass ratio of 80:20 for three times, and thereafter dried at 80° C. for 3 hours under a reduced pressure.

An obtained solid was analyzed by 1H-NMR (400 MHz, CDCl3, TMS). As a result of measurement of NMR (Nuclear Magnetic Resonance), a peak deriving from a vinylbenzyl group was confirmed at 5 to 7 ppm. By this, it was confirmed that the obtained solid was a modified polyphenylene ether having a group represented by the formula (1) at a terminal of the molecule. Specifically, it was confirmed that the obtained solid was a vinylbenzylated polyphenylene ether.

Also, the number of terminal functions in the modified polyphenylene ether was measured in the following manner.

First, the modified polyphenylene ether was precisely weighed. A weight at that time is assumed to be X (mg). Then, this weighed modified polyphenylene ether was dissolved into 25 mL of methylene chloride. Into the solution, 100 μL of an ethanol solution containing 10% by mass of tetraethylammonium hydroxide (TEAH) was added, and thereafter the absorbancy (Abs) at 318 nm was measured by using an UV (Ultra Violet) spectrophotometer. The above ethanol solution was TEAH:ethanol=15:85 in a volume ratio. The above UV spectrophotometer is UV-1600 manufactured by Shimadzu Corporation. Further, from the measurement result, the number of terminal hydroxyl groups in the modified polyphenylene ether was calculated.

$$\text{Residual OH amount } (\mu mol/g) = [(25 \times Abs)/(\in \times OPL \times X)] \times 10^6$$

Here, $\in$ represents an absorption coefficient and is 4700 L/mol·cm. Also, OPL is a cell optical length and is 1 cm.

Further, because the calculated residual OH amount (number of terminal hydroxyl groups) in the modified polyphenylene ether was almost zero, it was found that almost all of the hydroxyl groups in the polyphenylene ether before modification had been modified. From this, it was found that an amount of decrease from the number of terminal hydroxyl groups in the polyphenylene ether before modification was the number of terminal hydroxyl groups in the polyphenylene ether before modification. In other words, the number of terminal hydroxyl groups in the polyphenylene ether before modification was the number of terminal functional groups in the modified polyphenylene ether. That is, the number of terminal functions is 2.

Also, the intrinsic viscosity (IV) of the modified polyphenylene ether was measured in methylene chloride of 25° C. Specifically, the intrinsic viscosity (IV) of the modified polyphenylene ether was measured with a viscometer (AVS500 Visco System manufactured by Schott AG) by using a 0.18 g/45 ml methylene chloride solution of the modified polyphenylene ether (liquid temperature being 25° C.). As a result of this, the intrinsic viscosity (IV) of the modified polyphenylene ether was 0.086 dl/g.

Also, a molecular weight distribution of the modified polyphenylene ether was measured by using GPC. Further, from the obtained molecular weight distribution, the weight-average molecular weight (Mw) was calculated. As a result of this, Mw was 1900.

Here, in the modified PPE-1, both terminals of the polyphenylene ether are almost all modified by a vinylbenzyl group, so that the modified PPE-1 is also referred to as modified polyphenylene ether with vinylbenzyl at both terminals (denoted as modified PPE with VB at both terminals in Table 1).

Modified Polyphenylene Ether 2 (Modified PPE-2):

A modified polyphenylene ether in which a terminal hydroxyl group of a polyphenylene ether has been modified with a methacryl group is used. Specifically, the polyphenylene ether is SA9000 manufactured by SABIC Innovative Plastics Japan LLC., and has a weight-average molecular weight Mw of 1700 with the number of terminal functional groups being 2.

Here, in the modified PPE-2, both terminals of the polyphenylene ether are almost all modified by a methacryl group, so that the modified PPE-2 is also referred to as modified polyphenylene ether with methacryl at both terminals (denoted as modified PPE with methacryl at both terminals in Table 1).

Modified Polyphenylene Ether 3 (Modified PPE-3):

A modified polyphenylene ether which has been synthesized in the following manner and in which a terminal hydroxyl group of a polyphenylene ether has been modified with a vinylbenzyl group is used.

The modified PPE-3 is a modified polyphenylene ether obtained by allowing polyphenylene ether to react with chloromethylstyrene. Specifically, the modified PPE-3 is obtained by the following reaction.

First, adjustment of the molecular weight of polyphenylene ether was carried out.

A mixture is obtained by blending and mixing 200 g of polyphenylene ether, 65 g of bisphenol A as a phenol kind, and 65 g of benzoyl peroxide as an initiator. The above polyphenylene ether is NORYL 640-111 manufactured by SABIC Innovative Plastics Japan LLC., and has a weight-average molecular weight (Mw) of 47000. Further, the above benzoyl peroxide is NYPER BW manufactured by NOF Corporation. Into this mixture, 400 g of toluene is added as a solvent, followed by stirring at 90° C. for one hour. After the stirring is ended, a large amount of methanol is added to re-precipitate the polyphenylene ether, and an impurity is removed. The resultant is dried at 80° C. for 3 hours under a reduced pressure to remove the solvent completely. The molecular weight distribution of the polyphenylene ether obtained after this processing was measured by using GPC. Further, from the obtained molecular weight distribution, the weight-average molecular weight (Mw) was calculated. As a result of this, Mw was found to be 2000.

Subsequently, the terminal hydroxyl groups of the above polyphenylene ether made to have a low molecular weight (weight-average molecular weight (Mw) of 2000) are modified with a vinylbenzyl group.

Specifically, a one-liter three-neck flask having a thermoregulator, a stirring device, a cooling equipment, and a dropping funnel was loaded with 200 g of the above polyphenylene ether made to have a low molecular weight (weight-average molecular weight (Mw) of 2000), 65 g of a mixture of p-chloromethylstyrene and m-chloromethylstyrene in a mass ratio of 50:50, 1.92 g of tetra-n-butylammonium bromide, and 400 g of toluene. The above mixture of p-chloromethylstyrene and m-chloromethylstyrene is chloromethylstyrene (CMS) manufactured by Tokyo Chemical Industry Co., Ltd. The mixture is stirred for dissolution, and the resultant is heated until the liquid temperature becomes 75° C. Into this mixture liquid, an aqueous solution of sodium hydroxide (40 g of sodium hydroxide/40 g of water) is dropwise added in 20 minutes. Thereafter, the stirring is further continued at 75° C. for 4 hours. Subsequently, after the contents in the flask are neutralized with hydrochloric acid of 10% by mass, a large amount of methanol is added. This process produces a precipitate in the liquid within the flask. In other words, the product contained in a reaction liquid within the flask is re-precipitated. Further, this precipitate is taken out by filtration, washed with a mixture liquid of methanol and water in a mass ratio of 80:20 for three times, and thereafter dried at 80° C. for 3 hours under a reduced pressure.

Upon analysis by NMR or the like, the obtained solid was found to be vinylbenzylated modified polyphenylene ether. The molecular weight distribution of this modified polyphenylene ether was measured by using GPC. Further, from the obtained molecular weight distribution, the weight-average molecular weight (Mw) was calculated. As a result of this, Mw was found to be 2000. Also, the number of terminal functions of this modified polyphenylene ether was measured in a manner such as described above, with a result that the number of terminal functions was 2.

Here, because the number of terminal functional groups in this modified PPE-3 is about 2, it seems that both terminals are modified by a vinylbenzyl group. For this reason, the modified PPE-3 is also referred to as modified polyphenylene ether with vinylbenzyl at both terminals (denoted as modified PPE with VB at both terminals in Table 1).

Non-modified polyphenylene ether: A polyphenylene ether having a hydroxyl group at a terminal is used. Specifically, the non-modified polyphenylene ether is SA90 manufactured by SABIC Innovative Plastics Japan LLC., and has a weight-average molecular weight (Mw) of 1700.
(Curing Component)

Curing agent: Triallyl isocyanurate is used. Specifically, the curing agent is TAIC manufactured by Nippon Kasei Chemical Co., Ltd. with a weight-average molecular weight (Mw) of 249 and with the number of terminal double bonds being 3.

Epoxy compound: A dicyclopentadiene type epoxy resin is used. Specifically, the epoxy compound is EPICLON HP7200 manufactured by DIC Corporation.
(Others)

Reaction initiator: 1,3-bis(butylperoxyisopropyl)benzene is used. Specifically, the reaction initiator is PERBUTYL P manufactured by NOF Corporation.

Curing promoter: 2-ethyl-4-methylimidazole is used. Specifically, the curing promoter is 2E4MZ manufactured by Shikoku Chemicals Corporation.

[Method for Preparing Thermosetting Resin Composition]

Next, a method for preparing the thermosetting resin composition will be described.

First, each of the components was added into toluene and mixed in a blending ratio described in Table 1 so that a solid component concentration would be 60% by mass. The mixture was stirred for 60 minutes to prepare a resin composition (varnish) in a varnish form.

[Method for Preparing Metal-Clad Laminate]

Subsequently, after a glass cloth was impregnated with the obtained varnish, the resultant was heated and dried at 100° C. to 170° C. for about 3 minutes to 6 minutes, so as to prepare a prepreg. The above glass cloth is specifically #2116 type, E glass, manufactured by Nitto Boseki Co., Ltd. At that time, adjustment was made so that the content (resin content) of the components constituting the resin by the curing reaction, such as the polyphenylene ether compound such as the modified polyphenylene ether and the curing agent, would be about 50% by mass.

Subsequently, two sheets of the produced prepreg were laminated, and copper foil was disposed on both sides thereof as the metal layer, so as to prepare a body to be pressed. This was heated and pressurized under conditions with a temperature of 200° C. and a pressure of 3 MPa (megapascal) for 100 minutes, so as to fabricate a metal-clad laminate in which the copper foil had been bonded onto both surfaces.
(Metal Layer: Copper Foil)

Copper foil 1: copper foil treated with a silane coupling agent having a styryl group in a molecule (KBM-1403 manufactured by Shin-Etsu Chemical Co., Ltd., p-styryltrimethoxysilane) (copper foil subjected to a styrylsilane treatment: ten-point average roughness Rz: 1.5 μm)

Copper foil 2: copper foil treated with a silane coupling agent having a methacryl group in a molecule (KBM-503 manufactured by Shin-Etsu Chemical Co., Ltd., 3-methacryloxypropyltrimethoxysilane) (copper foil subjected to a methacrylsilane treatment: ten-point average roughness Rz: 1.8 μm)

Copper foil 3: copper foil treated with a silane coupling agent having a vinyl group in a molecule (KBM-1003 manufactured by Shin-Etsu Chemical Co., Ltd., vinyltrimethoxysilane) (copper foil subjected to a vinylsilane treatment: ten-point average roughness Rz: 2.0 μm)

Copper foil 4: copper foil treated with a silane coupling agent having an amino group in a molecule (KBM-903 manufactured by Shin-Etsu Chemical Co., Ltd., 3-aminopropyltrimethoxysilane) (copper foil subjected to an aminosilane treatment: ten-point average roughness Rz: 2.3 μm)

Copper foil 5: copper foil treated with a silane coupling agent having an amino group in a molecule (KBM-903 manufactured by Shin-Etsu Chemical Co., Ltd., 3-aminopropyltrimethoxysilane) (copper foil subjected to an aminosilane treatment: ten-point average roughness Rz: 9.2 μm)

Copper foil 6: copper foil treated with a silane coupling agent having a styryl group in a molecule (KBM-1403 manufactured by Shin-Etsu Chemical Co., Ltd., p-styrylmethoxysilane) (copper foil subjected to a styrylsilane treatment: ten-point average roughness Rz: 9.2 μm)

Each of the prepregs and the metal-clad laminates (evaluation substrates) prepared in the above-described manner was evaluated by a method shown below.

[Dielectric Properties (Dielectric Constant and Dielectric Loss Tangent]

The dielectric constant and the dielectric loss tangent of the evaluation substrate at 10 GHz were measured by a cavity resonator perturbation method. Specifically, with use of a network analyzer, the dielectric constant and the dielectric loss tangent of the evaluation substrate at 10 GHz were measured. This network analyzer is N5230A manufactured by Agilent Technologies Inc.

[Peel Strength]

In the metal-clad laminate, a peeling strength of the copper foil from the insulating layer was measured in accordance with JIS C6481. A pattern with a width of 10 mm and a length of 100 mm was formed and peeled off at a speed of 50 mm/minute with a tensile tester, and the peeling strength (peel strength) at that time was measured. A measurement unit is N/mm.

[Glass Transition Temperature (Tg)]

The Tg of the prepreg was measured by using a viscoelasticity spectrometer "DMS100" manufactured by Seiko Instruments Inc. At this time, dynamic viscoelasticity measurement (DMA) was carried out with a bending module by setting a frequency to be 10 Hz. The temperature at which tan δ showed a local maximal value when the temperature was raised from room temperature up to 280° C. under conditions with a temperature raising speed of 5° C./minute was determined as the Tg.

[Heat Resistance]

The heat resistance (T288) of the metal-clad laminate was evaluated in accordance with IPC TM650.

Specifically, with use of a thermal mechanical analyzer (TMA), the metal-clad laminate was heated to 288° C., and the period of time until delamination occurred was measured.

[Transmission Loss]

After a wiring was formed on one surface of the metal-clad laminate, two sheets of the above prepreg and the same copper foil as was used in the metal-clad laminate were laminated on the surface on which this wiring had been formed, and the resultant was heated and pressurized under the same conditions as in producing the above metal-clad laminate. By this process, a multiple-layer printed wiring board provided with an inner-layer wiring was obtained. Further, an electric signal having a frequency of 10 GHz was applied to the inner-layer wiring of this multiple-layer printed wiring board. A transmission loss (dB/m) when the electric signal applied to the inner-layer wiring was transmitted through an inner-layer circuit was measured.

The results in each of the evaluations described above are shown in Table 1.

TABLE 1

| | | | | Examples | | | | | Comparative Examples | | | |
|---|---|---|---|---|---|---|---|---|---|---|---|---|
| | | | | 1 | 2 | 3 | 4 | 5 | 1 | 2 | 3 | 4 |
| Thermosetting resin composition (parts by mass) | PPE | Modified PPE-1 | Modified PPE with VB at both terminals | 70 | — | — | 70 | 70 | — | 70 | 70 | 70 |
| | | Modified PPE-2 | Modified PPE with methacryl at both terminals | — | 70 | — | — | — | — | — | — | — |
| | | Modified PPE-3 | Modified PPE with VB at both terminals | — | — | 70 | — | — | — | — | — | — |
| | | Non-modified PPE | | — | — | — | — | — | 70 | — | — | — |
| | Curing components | Curing agent | TAIC | 30 | 30 | 30 | 30 | 30 | — | 30 | 30 | 30 |
| | | Epoxy compound | EPICLON HP7200 | — | — | — | — | — | 30 | — | — | — |
| | Reaction initiator | | PERBUTYL P | 2 | 2 | 2 | 2 | 2 | — | 2 | 2 | 2 |
| | Curing promoter | | 2E4MZ | — | — | — | — | — | 0.5 | — | — | — |
| Metal layer | Copper foil 1 | Styrylsilane treatment | Rz 1.5 μm | O | O | O | — | — | O | — | — | — |
| | Copper foil 2 | Methacrylsilane treatment | Rz 1.8 μm | — | — | — | O | — | — | — | — | — |
| | Copper foil 3 | Vinylsilane treatment | Rz 2.0 μm | — | — | — | — | O | — | — | — | — |
| | Copper foil 4 | Aminosilane treatment | Rz 2.3 μm | — | — | — | — | — | — | O | — | — |
| | Copper foil 5 | Aminosilane treatment | Rz 9.2 μm | — | — | — | — | — | — | — | O | — |
| | Copper foil 6 | Styrylsilane treatment | Rz 9.2 μm | — | — | — | — | — | — | — | — | O |
| Evaluation | Dielectric constant | | | 3.7 | 3.7 | 3.7 | 3.7 | 3.7 | 3.9 | 3.7 | 3.7 | 3.7 |
| | Dielectric loss tangent | | | 0.005 | 0.005 | 0.005 | 0.005 | 0.005 | 0.011 | 0.005 | 0.005 | 0.005 |
| | Peel strength (N/mm) | | | 9 | 9 | 8 | 8 | 7 | 4 | 1 | 8 | 12 |
| | Glass transition temperature Tg (° C.) | | | 220 | 230 | 200 | 220 | 220 | 190 | 220 | 220 | 22 |
| | Heat resistance [T-288 (minutes)] | | | >60 | >60 | >60 | >60 | >60 | 40 | <1 | >60 | >60 |
| | Transmission loss (dB/m) | | | −22 | −23 | −22 | −23 | −23 | −31 | −23 | −28 | −28 |

From Table 1, the dielectric constant and the dielectric loss tangent of Examples 1 to 5 having the insulating layer including the cured product of the thermosetting resin composition including the modified polyphenylene ether and the curing agent are lower than those of Comparative Example 1 including another cured product.

Also, it will be understood that the peel strength of the copper foils of Examples 1 to 5 using the metal layer subjected to the surface treatment with a silane coupling agent having a carbon-to-carbon unsaturated bond in a molecule is high, and the copper foils are hardly peeled off, even though the ten-point average roughness Rz is 2.5 μm or less. In contrast, the peel strength of Comparative Example 2 using the metal layer subjected to the surface treatment with a silane coupling agent that does not have a carbon-to-carbon unsaturated bond in a molecule was low.

Also, it has been found that, though the dielectric constant and the dielectric loss tangent do not change greatly, the transmission loss of Examples 1 to 5 using the metal layer having a ten-point average roughness Rz of 2.5 μm or less was lower as compared with that of Comparative Examples 3 and 4 using the metal layer having a ten-point average roughness Rz exceeding 2.5 μm.

From the above, it will be understood that the metal foil with resin according to one exemplary embodiment of the present disclosure can produce a printed wiring board in which the peeling-off of the metal layer is sufficiently suppressed, and the transmission loss is low.

By fabricating a printed wiring board using the metal-clad laminate of the present disclosure, peeling-off of the wiring from the insulating layer is suppressed, and the transmission loss of the printed wiring board is reduced. For this reason, it is expected that this printed wiring board is used in electronic device that transmit and receive electric signals at a high speed.

The invention claimed is:

1. A metal-clad laminate comprising:
   a cured insulating layer including a polyphenylene ether compound;
   a metal layer joined with the cured insulating layer; and
   an intermediate layer interposed between the cured insulating layer and the metal layer, the intermediate layer including a silane compound,
   wherein:
   the metal layer has a junction surface that is joined with the cured insulating layer via the intermediate layer,
   the junction surface has a ten-point average roughness Rz ranging from 0.5 μm to 4 μm inclusive,
   the entirety of the polyphenylene ether compound included in the cured insulating layer is a cured product of a modified polyphenylene ether having a terminal functional group including a carbon-to-carbon unsaturated bond,
   the cured insulating layer is a cured product of a thermosetting resin composition,
   the thermosetting resin composition contains: the modified polyphenylene ether and a curing agent including a carbon-to-carbon unsaturated bond,
   a content ratio of the curing agent is from 10 parts by mass to 70 parts by mass relative to 100 parts by mass of a total amount of the modified polyphenylene ether and the curing agent, and
   the modified polyphenylene ether has a weight-average molecular weight ranging from 500 to 3000 inclusive.

2. The metal-clad laminate according to claim 1, wherein an intrinsic viscosity of the modified polyphenylene ether ranges from 0.03 dl/g to 0.12 dl/g inclusive.

3. The metal-clad laminate according to claim 1, wherein the functional group of the terminal of the modified polyphenylene ether is at least one selected from the group consisting of vinylbenzyl group, vinyl group, acrylate group, and methacrylate group.

4. The metal-clad laminate according to claim 1, wherein the curing agent is at least one selected from the group consisting of styrene, divinylbenzene, an acrylate compound, a methacrylate compound, a trialkenyl isocyanurate compound, and polybutadiene.

5. The metal-clad laminate according to claim 1, wherein the modified polyphenylene ether has a weight-average molecular weight ranging from 500 to 2000 inclusive.

6. The metal-clad laminate according to claim 1, wherein the junction surface has a ten-point average roughness Rz ranging from 0.5 μm to 2.5 μm inclusive.

7. The metal-clad laminate according to claim 1, wherein the insulating layer further includes a fibrous base material.

8. The metal-clad laminate according to claim 1, wherein the modified polyphenylene ether has a weight-average molecular weight ranging from 1000 to 3000 inclusive.

9. The metal-clad laminate according to claim 1, wherein the silane compound in the intermediate layer is derived from a silane coupling agent.

10. The metal-clad laminate according to claim 9, wherein the silane coupling agent has at least one functional group selected from the group consisting of styryl group, vinyl group, acryl group, and methacryl group.

11. A metal foil with resin, comprising:
an uncured insulating layer including a polyphenylene ether compound;
a metal layer joined with the uncured insulating layer; and
an intermediate layer interposed between the uncured insulating layer and the metal layer, the intermediate layer including a silane compound,
wherein:
the metal layer has a junction surface that is joined with the uncured insulating layer via the intermediate layer,
the junction surface has a ten-point average roughness Rz ranging from 0.5 μm to 4 μm inclusive,
the entirety of the polyphenylene ether compound included in the uncured insulating layer is a modified polyphenylene ether having a terminal functional group including a carbon-to-carbon unsaturated bond,
the uncured insulating layer includes a thermosetting resin composition,
the thermosetting resin composition contains: the modified polyphenylene ether and a curing agent including a carbon-to-carbon unsaturated bond,
a content ratio of the curing agent is from 10 parts by mass to 70 parts by mass relative to 100 parts by mass of a total amount of the modified polyphenylene ether and the curing agent, and
the modified polyphenylene ether has a weight-average molecular weight ranging from 500 to 3000 inclusive.

12. The metal foil with resin according to claim 11, wherein an intrinsic viscosity of the modified polyphenylene ether ranges from 0.03 dl/g to 0.12 dl/g inclusive.

13. The metal foil with resin according to claim 11, wherein the modified polyphenylene ether has a weight-average molecular weight ranging from 500 to 2000 inclusive.

14. The metal foil with resin according to claim 11, wherein the modified polyphenylene ether has a weight-average molecular weight ranging from 1000 to 3000 inclusive.

15. The metal foil with resin according to claim 11, wherein the silane compound in the intermediate layer is derived from a silane coupling agent.

16. The metal foil with resin according to claim 15, wherein the silane coupling agent has at least one functional group selected from the group consisting of styryl group, vinyl group, acryl group, and methacryl group.

17. A printed wiring board comprising:
a cured insulating layer including a polyphenylene ether compound;
a wiring joined with the cured insulating layer; and
an intermediate layer interposed between the cured insulating layer and the wiring, the intermediate layer including a silane compound,
wherein:
the wiring has a junction surface that is joined with the cured insulating layer via the intermediate layer,
the junction surface has a ten-point average roughness Rz ranging from 0.5 μm to 4 μm inclusive,
the entirety of the polyphenylene ether compound included in the cured insulating layer is a cured product of a modified polyphenylene ether having a terminal functional group including a carbon-to-carbon unsaturated bond,
the cured insulating layer is a cured product of a thermosetting resin composition,
the thermosetting resin composition contains: the modified polyphenylene ether and a curing agent including a carbon-to-carbon unsaturated bond,
a content ratio of the curing agent is from 10 parts by mass to 70 parts by mass relative to 100 parts by mass of a total amount of the modified polyphenylene ether and the curing agent, and
the modified polyphenylene ether has a weight-average molecular weight ranging from 500 to 3000 inclusive.

18. The printed wiring board according to claim 17, wherein an intrinsic viscosity of the modified polyphenylene ether ranges from 0.03 dl/g to 0.12 dl/g inclusive.

19. The printed wiring board according to claim 17, wherein the modified polyphenylene ether has a weight-average molecular weight ranging from 500 to 2000 inclusive.

20. The printed wiring board according to claim 17, wherein the modified polyphenylene ether has a weight-average molecular weight ranging from 1000 to 3000 inclusive.

21. The printed wiring board according to claim 17, wherein the silane compound in the intermediate layer is derived from a silane coupling agent.

22. The printed wiring board according to claim 21, wherein the silane coupling agent has at least one functional group selected from the group consisting of styryl group, vinyl group, acryl group, and methacryl group.

23. A method for producing a metal-clad laminate, the method comprising:
preparing an uncured insulating layer including a polyphenylene ether compound;
joining a metal layer with the uncured insulating layer; and
curing the uncured insulating layer to form a cured insulating layer,
wherein:

an intermediate layer including a silane compound is interposed between the cured insulating layer and the metal layer, the metal layer has a junction surface that is joined with the cured insulating layer via the intermediate layer, the junction surface has a ten-point average roughness Rz ranging from 0.5 μm to 4 μm inclusive, the entirety of the polyphenylene ether compound included in the cured insulating layer is a cured product of a modified polyphenylene ether having a terminal functional group including a carbon-to-carbon unsaturated bond, the uncured insulating layer includes a thermosetting resin composition, the thermosetting resin composition contains: the modified polyphenylene ether and a curing agent including a carbon-to-carbon unsaturated bond, a content ratio of the curing agent is from 10 parts by mass to 70 parts by mass relative to 100 parts by mass of a total amount of the modified polyphenylene ether and the curing agent, and the modified polyphenylene ether has a weight-average molecular weight ranging from 500 to 3000 inclusive.

24. The method for producing the metal-clad laminate according to claim 23, wherein an intrinsic viscosity of the modified polyphenylene ether ranges from 0.03 dl/g to 0.12 dl/g inclusive.

25. The method for producing the metal-clad laminate according to claim 23, wherein the modified polyphenylene ether has a weight-average molecular weight ranging from 500 to 2000 inclusive.

26. The method for producing the metal-clad laminate according to claim 23, wherein the modified polyphenylene ether has a weight-average molecular weight ranging from 1000 to 3000 inclusive.

27. The method for producing the metal-clad laminate according to claim 23, wherein the silane compound in the intermediate layer is derived from a silane coupling agent.

28. The method for producing the metal-clad laminate according to claim 27, wherein the silane coupling agent has at least one functional group selected from the group consisting of styryl group, vinyl group, acryl group, and methacryl group.

* * * * *